US009929236B1

(12) United States Patent
Paul et al.

(10) Patent No.: US 9,929,236 B1
(45) Date of Patent: Mar. 27, 2018

(54) ACTIVE AREA SHAPES REDUCING DEVICE SIZE

(71) Applicant: GLOBALFOUNDRIES INC., Grand Cayman (KY)

(72) Inventors: Bipul C. Paul, Mechanicville, NY (US); Kwan-Yong Lim, Niskayana, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/624,762

(22) Filed: Jun. 16, 2017

Related U.S. Application Data

(62) Division of application No. 15/423,647, filed on Feb. 3, 2017, now Pat. No. 9,761,662.

(51) Int. Cl.
| | |
|---|---|
| *H01L 29/786* | (2006.01) |
| *H01L 29/06* | (2006.01) |
| *H01L 27/11* | (2006.01) |
| *H01L 29/423* | (2006.01) |
| *H01L 21/8238* | (2006.01) |

(52) U.S. Cl.
CPC .. *H01L 29/0692* (2013.01); *H01L 21/823814* (2013.01); *H01L 21/823885* (2013.01); *H01L 27/1108* (2013.01); *H01L 29/42392* (2013.01); *H01L 29/78642* (2013.01)

(58) Field of Classification Search
CPC ......... H01L 29/0692; H01L 21/823814; H01L 21/823885; H01L 27/1108; H01L 29/42392; H01L 29/78642
See application file for complete search history.

(56) References Cited

U.S. PATENT DOCUMENTS

| | | |
|---|---|---|
| 6,346,468 B1 | 2/2002 | Pradeep et al. |
| 6,960,514 B2 | 11/2005 | Beinter et al. |
| 7,135,727 B2 | 11/2006 | Lee et al. |
| 7,524,732 B2 | 4/2009 | Pan et al. |
| 7,616,245 B2 | 11/2009 | Rhodes |

(Continued)

OTHER PUBLICATIONS

Thean, et al., "Vertical Device Architecture for 5nm and beyond: Device & Circuit Implications," 2015 Symposium on VLSI Technology Digest of Technical Papers. pp. T26-T27.

(Continued)

*Primary Examiner* — Walter H Swanson
(74) *Attorney, Agent, or Firm* — Gibb & Riley, LLC; Francois Pagette

(57) ABSTRACT

Methods form structures to include a first pair of complementary transistors (having first and second transistors) and a second pair of complementary transistors (having third and fourth transistors). An active area of the first transistor contacts an active area of the second transistor along a first common edge that is straight, and an active area of the third transistor contacts an active area of the fourth transistor along a second common edge that is straight and parallel to the first common edge. The active area of the second transistor has a third edge, opposite the first common edge, that has a non-linear shape, and the active area of the third transistor has a fourth edge, opposite the second common edge, that has the same non-linear shape. The non-linear shape of the third edge faces and is inverted relative to the non-linear shape of the fourth edge.

20 Claims, 10 Drawing Sheets

(56) References Cited

U.S. PATENT DOCUMENTS

| | | | |
|---|---|---|---|
| 7,807,343 B2 | 10/2010 | Rathsack et al. | |
| 7,919,792 B2 | 4/2011 | Law et al. | |
| 8,154,086 B2 | 4/2012 | Masuoka et al. | |
| 8,286,114 B2 | 10/2012 | Chuang et al. | |
| 8,754,481 B2 | 6/2014 | Masuoka et al. | |
| 8,872,161 B1 * | 10/2014 | Ching | H01L 29/0673 257/24 |
| 9,123,808 B2 * | 9/2015 | Lutz | H01L 29/7848 |
| 2007/0063242 A1 | 3/2007 | Doyle | |
| 2010/0203714 A1 | 8/2010 | Masuoka et al. | |
| 2015/0179655 A1 | 6/2015 | Nakanishi et al. | |
| 2015/0318288 A1 | 11/2015 | Lim et al. | |
| 2016/0099338 A1 * | 4/2016 | Chang | H01L 21/3065 257/347 |

OTHER PUBLICATIONS

Office Action Communication, U.S. Appl. No. 15/423,647, dated Mar. 31, 2017, pp. 1-5.

Notice of Allowance Communication, U.S. Appl. No. 15/423,647, dated Jun. 6, 2017, pp. 1-14.

\* cited by examiner

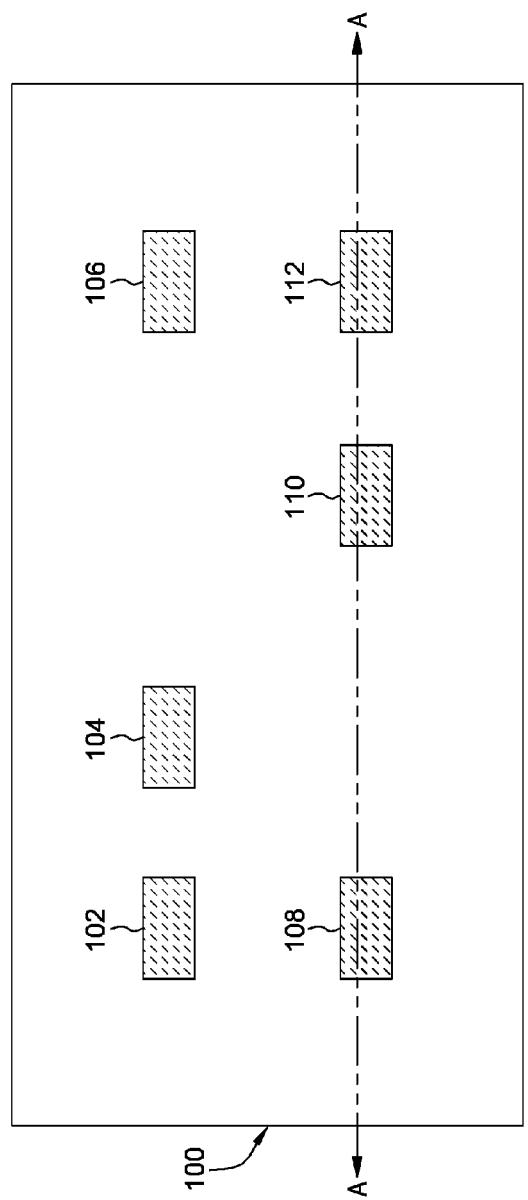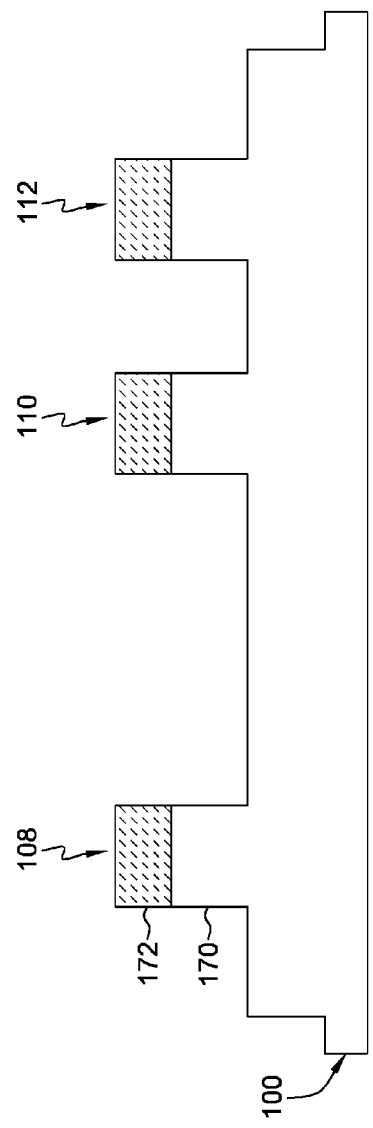

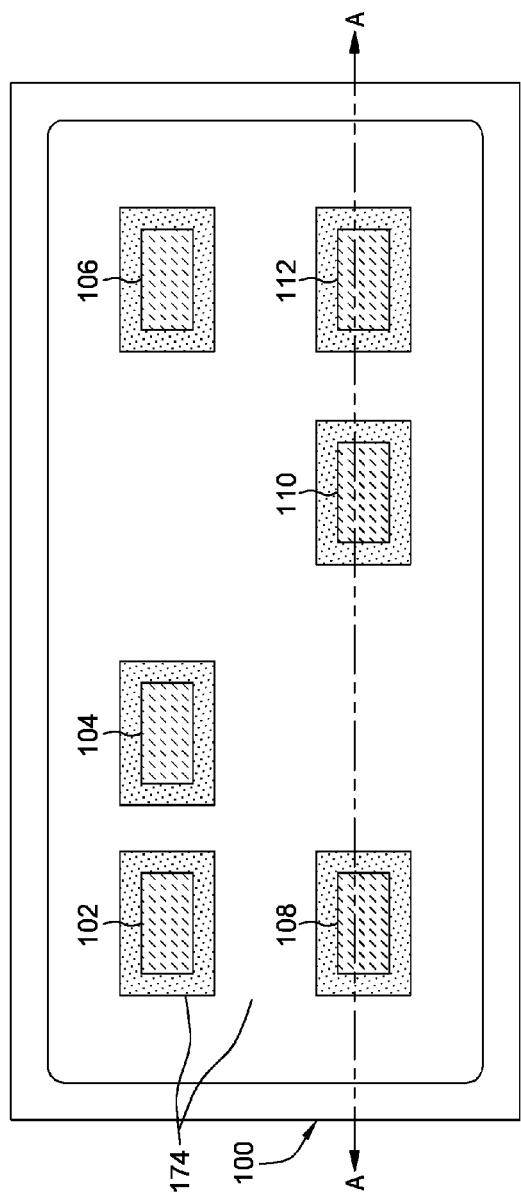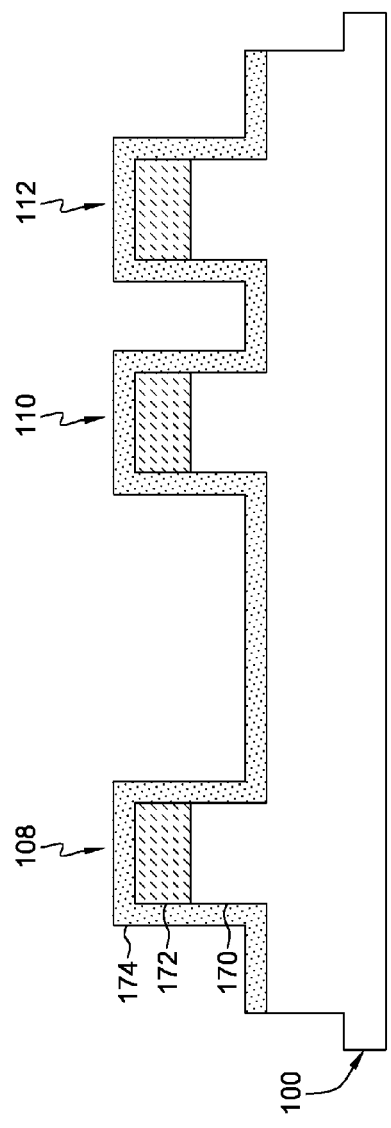
FIG. 4A
FIG. 4B

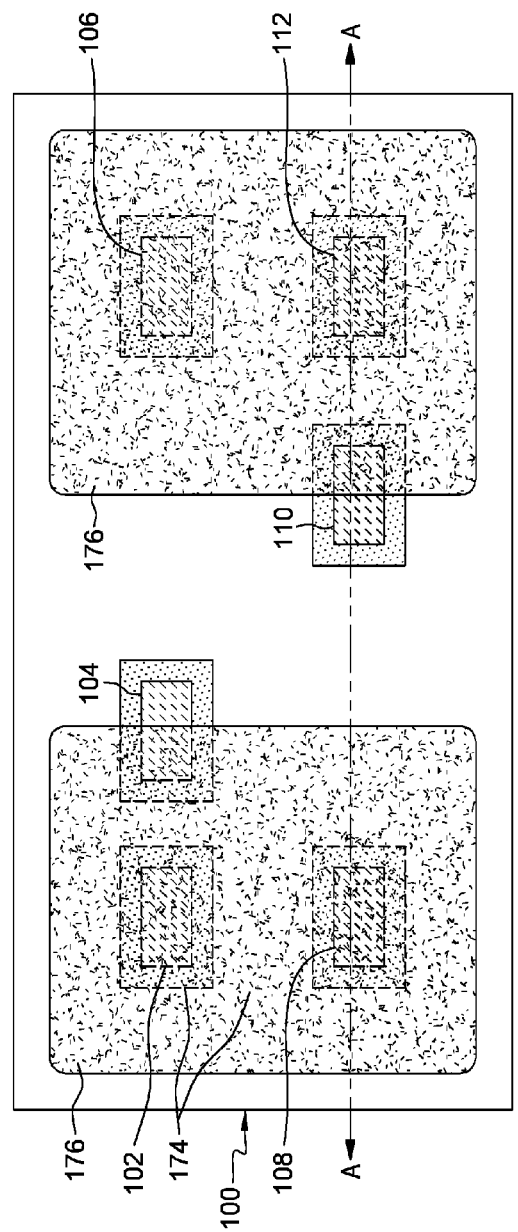
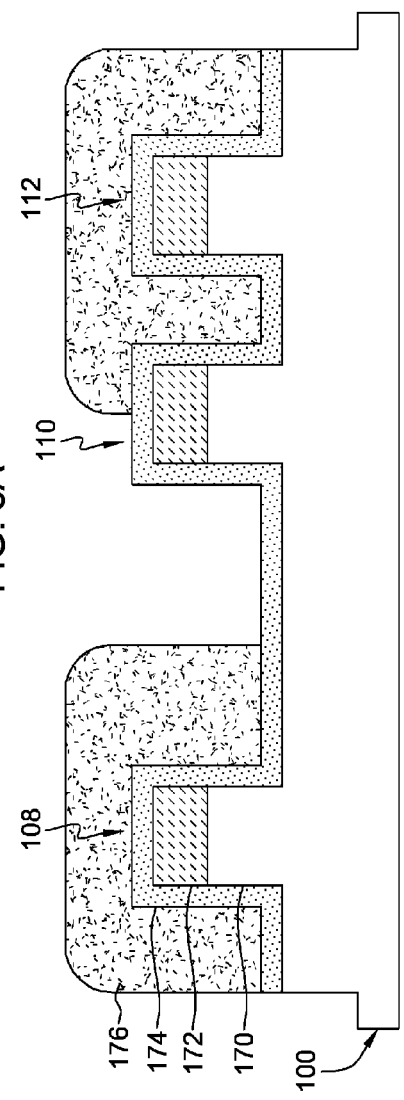
FIG. 5A
FIG. 5B

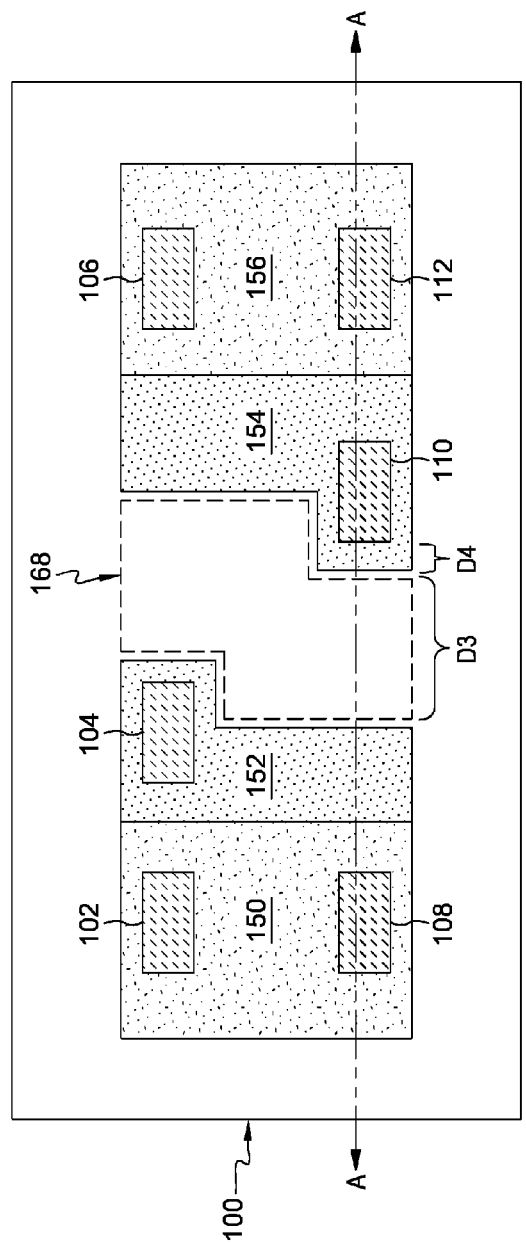
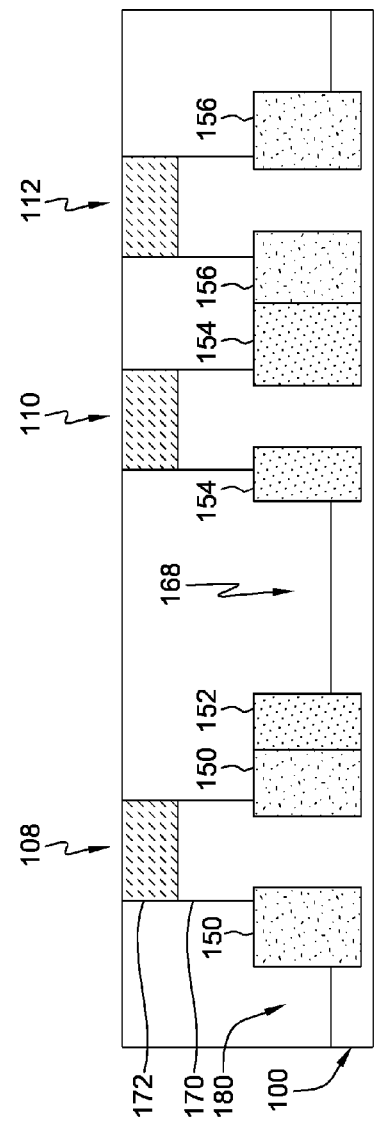

ACTIVE AREA SHAPES REDUCING DEVICE SIZE

CROSS-REFERENCE TO RELATED APPLICATIONS

The present invention claims the benefit under 35 U.S.C. § 120 as a divisional of U.S. patent application Ser. No. 15/423,647 filed on Feb. 3, 2017, issued as U.S. Pat. No. 9,761,662 on Sep. 12, 2017, the entire teachings of which are incorporated herein by reference.

BACKGROUND

The present disclosure relates to integrated circuit structures and methods, and more specifically, to methods that produce devices that have active area shapes that reduce device size.

Transistorized devices continue to enjoy size reductions because of technological advances. For example, gate all around (GAA) device structures are replacing fin-type field effect transistors (FINFET) in order to achieve continued scaling, which may otherwise be limited by poor electrostatics in FINFET devices.

However, conventional static random access memory (SRAM) architectures may not scale with GAA devices (such as nanosheet FET or vertical FET (VFET) devices) and hence, SRAM scaling may be challenged beyond FINFET technology. For example, it can be difficult to scale the bitcell area of SRAM structures due to various contact and isolation requirements. As a result, new constructs are being presented to allow continued scaling in SRAM with GAA structures like VFET.

SUMMARY

Exemplary transistor structures herein include (among other components) a substrate having a planar surface, a first set of transistors on the planar surface, and a second set of transistors on the planar surface adjacent the first pair of complementary transistors. The first set includes a gate, and a pair of complementary transistors (that include a first transistor and a second transistor). The first transistor has an opposite polarity from the second transistor. Similarly, the second set includes a gate, and a pair of complementary transistors (that include a third transistor and a fourth transistor). Similarly, the third transistor has an opposite polarity from the fourth transistor.

The first transistor and the fourth transistor have the same first doping impurities and the same first polarity. The second transistor and the third transistor have the same second doping impurities and the same second polarity. The first doping impurities are different from (have opposite polarity of) the second doping impurities.

The active area of the first transistor is a four-sided rectangular shape along the planar surface. One side of the active area of the first transistor contacts an active area of the second transistor along a first common edge that is straight. Similarly, the active area of the fourth transistor is a four-sided rectangular shape along the planar surface. One side of the active area of the fourth transistor contacts the active area of the third transistor along a second common edge that is straight and parallel to the first common edge. The active areas of the second and third transistors are between the active areas of the first and fourth transistors, along the planar surface.

The first common edge is shared by the active area of the first transistor and the active area of the second transistor and defines the border between the active area of the first transistor and the active area of the second transistor. The second common edge is shared by the active area of the third transistor and the active area of the fourth transistor and defines the border between the active area of the third transistor and the active area of the fourth transistor.

The active area of the second transistor lies along the planar surface and has a third edge, opposite the first common edge, that has a non-linear shape. The active area of the third transistor lies along the planar surface and has a fourth edge, opposite the second common edge, that has the same non-linear shape. The third edge is separated from the fourth edge only by an insulator.

The active areas of the first and fourth transistors have the same four-sided rectangular shape and size along the planar surface. The active areas of the second and third transistors have the same six-sided shape and size along the planar surface. The shape of the active area of the third transistor is inverted relative to the shape of the active area of the second transistor along the planar surface.

More specifically, the non-linear shape of the third edge faces the non-linear shape of the fourth edge along the planar surface, and the non-linear shape of the third edge is inverted relative to the non-linear shape of the fourth edge along the planar surface. The non-linear shape has two sections parallel to the first common edge and the second common edge, and a third section perpendicular to the two sections that connects the two sections.

Methods herein form transistor structure and include (among other processes) processing that forms fins on a planar surface of a substrate, and processing that patterns the planar surface of the substrate to define an area for a first pair of complementary transistors and a second pair of complementary transistors adjacent the first pair of complementary transistors. The patterning process includes fins for a first transistor and a second transistor in the area for the first pair of complementary transistors, and fins for a third transistor and a fourth transistor in the area for the second pair of complementary transistors.

The patterning process patterns an active area of the first transistor to have a four-sided rectangular shape along the planar surface, so that one side of the active area of the first transistor contacts an active area of the second transistor along a first common edge that is straight. The patterning process similarly patterns an active area of the fourth transistor to have a four-sided rectangular shape along the planar surface, so that one side of the active area of the fourth transistor contacts an active area of the third transistor along a second common edge that is straight and parallel to the first common edge.

The active area of the second transistor and the active area of the third transistor are patterned to be between the active area of the first transistor and the active area of the fourth transistor along the planar surface.

The patterning process patterns the first common edge to be shared by the active area of the first transistor and the active area of the second transistor and to define the border between the active area of the first transistor and the active area of the second transistor. The patterning process patterns the second common edge to be shared by the active area of the third transistor and the active area of the fourth transistor and to define the border between the active area of the third transistor and the active area of the fourth transistor.

Such patterning also patterns the active area of the second transistor to lie along the planar surface and to have a third edge, opposite the first common edge, that has a non-linear shape. This patterning similarly patterns the active area of the third transistor to lie along the planar surface and to have a fourth edge, opposite the second common edge, that has the same non-linear shape. The patterning forms the non-linear shape to have two sections parallel to the first common edge and the second common edge, and a third section perpendicular to the two sections that connects the two sections.

Further, this processing patterns the non-linear shape of the third edge to face the non-linear shape of the fourth edge along the planar surface, and patterns the non-linear shape of the third edge to be inverted relative to the non-linear shape of the fourth edge along the planar surface. This process patterns the third edge to be separated from the fourth edge only by an insulator.

Such methods also dope (add impurities to) the area for the first pair of complementary transistors adjacent the fins to provide the first transistor with an opposite polarity from the second transistor. Similarly, these methods dope (add impurities to) the area for the second pair of complementary transistors adjacent the fins to provide the third transistor with an opposite polarity from the fourth transistor.

The doping of the area for the first and second pairs of complementary transistors dopes the first transistor and the fourth transistor to have the same first doping impurities and the same first polarity, and dopes the second transistor and the third transistor to have the same second doping impurities and the same second polarity. The first doping impurities are different (have an opposite polarity) from the second doping impurities.

BRIEF DESCRIPTION OF THE DRAWINGS

The embodiments herein will be better understood from the following detailed description with reference to the drawings, which are not necessarily drawn to scale and in which:

FIG. 3A is a schematic diagram illustrating a top view of devices herein;

FIG. 3B is a schematic diagram illustrating a side view of the devices shown in FIG. 3A;

FIG. 4A is a schematic diagram illustrating a top view of devices herein;

FIG. 4B is a schematic diagram illustrating a side view of the devices shown in FIG. 4A;

FIG. 5A is a schematic diagram illustrating a top view of devices herein;

FIG. 5B is a schematic diagram illustrating a side view of the devices shown in FIG. 5A;

FIG. 8A is a schematic diagram illustrating a top view of devices herein;

FIG. 8B is a schematic diagram illustrating a side view of the devices shown in FIG. 8A;

DETAILED DESCRIPTION

As mentioned above, new structures and processes allow continued scaling (size reduction) in integrated circuit devices, such as static random access memories (SRAM) with gate all around (GAA) structures (e.g., vertical field effect transistors (VFET)). This disclosure provides an active area (RX) patterning technique in SRAM to enable further device scaling. With the structures and methods presented herein, bottom RX contacts are used to implement x-couple connections in SRAM. Conventional structures may use rectangular RX areas for patterning simplicity; however, this can limits the area scaling, by not having optimal RX pattering. The RX patterning techniques herein utilize the difference in space requirements between N-type and P-type transistors to optimize the RX patterning and hence, achieve better area scaling. In addition, this disclosure provides an integration flow to enable such RX patterning.

Thus, this disclosure provides optimal bottom source-drain (SD) RX design to achieve SRAM bitcell size scaling in VFET. Further, the integration flow presented herein achieves optimal (non-rectangular) RX patterning, where a thin oxide layer deposition after FIN formation protects FIN sidewalls from etch damage during RX reactive ion etching (RIE). This thin oxide deposited between FINs provides maskless RX space patterning, which enables the formation of very small RX space. This, in turn, eliminates the patterning limitation on RX space, which is thus limited only by STI formation.

Figure 1:
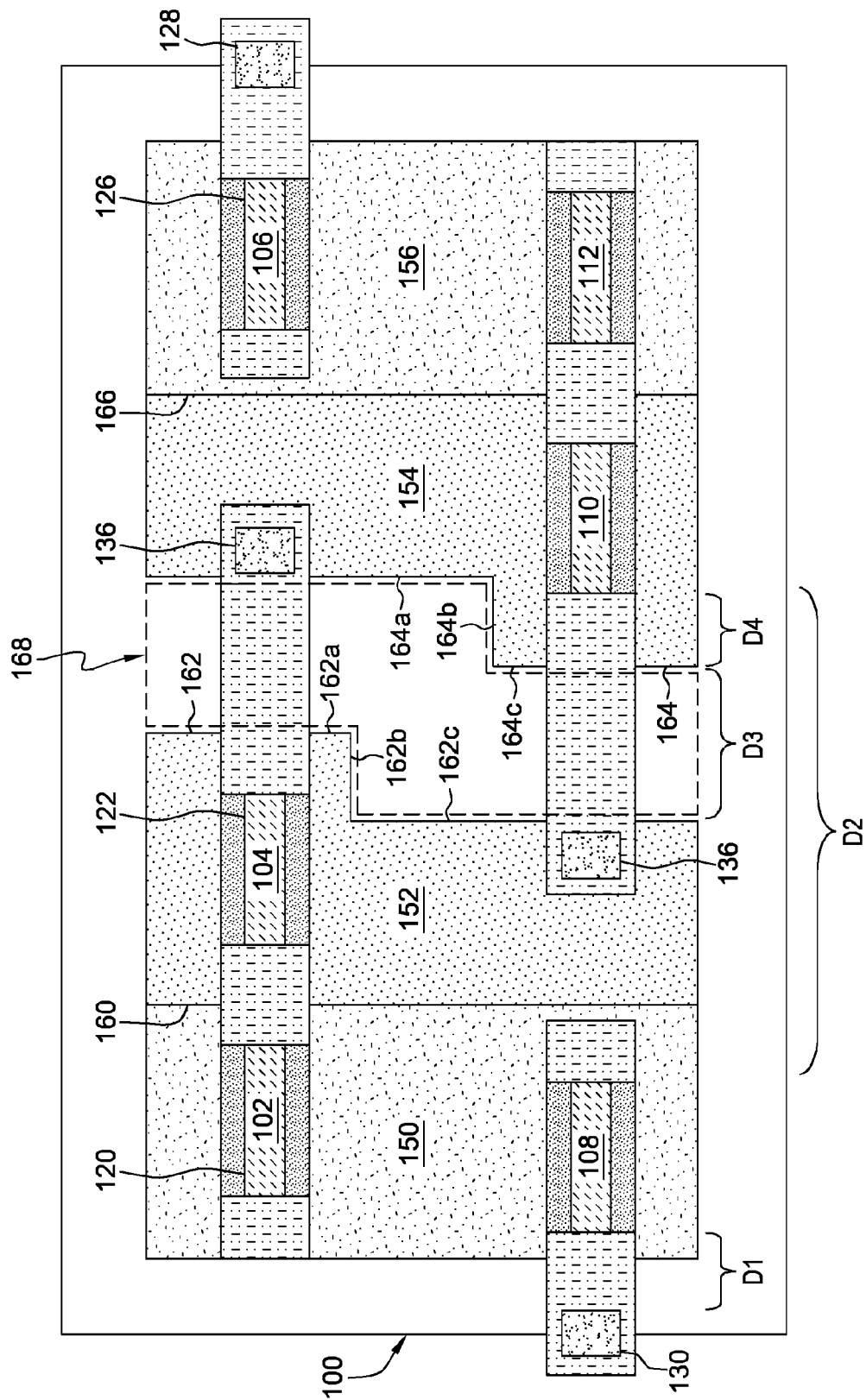
FIGS. 1 and 2 are schematic diagrams illustrating a top view of devices herein.

As shown in FIG. 1, exemplary transistor structures herein include (among other components) a substrate 100 having a planar surface, a first pair of complementary transistors (for example, 102, 104) on the planar surface, a second pair of complementary transistors (for example, 110, 112) on the planar surface adjacent the first pair of complementary transistors, along with associated pass transistors 106, 108.

For example, each SRAM cell includes two pull-down transistors, two pull-up transistors, and two pass transistors. As shown in FIG. 1, the transistor 102 can be a pull-down transistor, transistor 104 can be a pull-up transistor, and transistor 106 can be a pass transistor. Similarly, the transistor 112 can be a pull-down transistor, transistor 110 can be a pull-up transistor, and transistor 108 can be a pass transistor. Additionally, FIG. 1 illustrates a Vss (negative or ground) connection 120, a Vdd (positive) connection 122, a bitline 126, a wordline 128, gate contact 130 (CB), buried contacts 136, that are used in SRAM operations. Those ordinarily skilled in the art would understand that the structures and methods herein are applicable to all forms of integrated circuit devices, and not just SRAM cells; and that the use of a SRAM as an illustrative example in this disclosure, is not intended to limit the application of the claims presented at the end of this application to only SRAM cells because, as mentioned above, the structures and methods herein are applicable to all forms of integrated circuit devices.

Thus, a first pair of complementary transistors includes the first transistor 102 and the second transistor 104, and the first transistor 102 has an opposite polarity (e.g., N-type transistor vs. P-type transistor) from the second transistor 104. Similarly, a second pair of complementary transistors includes the third transistor 110 and the fourth transistor 112, and the third transistor 110 has an opposite polarity from the fourth transistor 112.

The first transistor 102, the opposing second pass transistor 108, and the fourth transistor 112 have the same "first" doping impurities and the same "first" polarity (e.g., N-type impurities). The second transistor 104, the opposing first pass transistor 106, and the third transistor 110 have the same "second" doping impurities and the same "second" polarity (e.g., P-type impurities). The first doping impurities are different from (have opposite polarity of) the second doping impurities.

The active area 150 of the first transistor 102 and pass transistor 108 is a four-sided rectangular shape along (within the plane of) the planar surface. One side of the active area 150 of the first transistor 102 contacts the active area 152 of the second transistor 104 along a first common edge 160 that is straight. Similarly, the active area 156 of the fourth transistor 112 and pass transistor 106 is a four-sided rectangular shape along (within the plane of) the planar surface. One side of the active area 156 of the fourth transistor 112 contacts the active area 154 of the third transistor 110 along a second common edge 166 that is straight and parallel to the first common edge 160. Therefore, the first and second common edges 160, 166 run along straight lines from one side (e.g., the top) to an opposing side (e.g., the bottom) of their respective active areas. As shown in FIG. 1, the active area of the second and third transistors 152, 154 are between the active areas of the first and fourth transistors 150, 156, along the planar surface.

The first common edge 160 is shared by the active area 150 of the first transistor 102 and the active area 152 of the second transistor 104 and defines the border between the active area 150 of the first transistor 102 and the active area 152 of the second transistor 104. Similarly, the second common edge 166 is shared by the active area 154 of the third transistor 110 and the active area 156 of the fourth transistor 112 and defines the border between the active area 152 of the third transistor 110 and the active area 156 of the fourth transistor 112.

The active area 152 of the second transistor 104 lies along the planar surface and has a third side or edge 162, opposite the first common edge 160, which has a non-linear shape. Similarly, the active area 154 of the third transistor 110 lies along the planar surface and has a fourth side or edge 164, opposite the second common edge 166, which has the same non-linear shape. The third edge 162 is separated from the fourth edge 164 only by an insulator area 168, and does not contact the third edge 162.

The active area 150 of the first transistor 102 and the active area 156 of the fourth transistor 112 have the same four-sided rectangular shape and size along the planar surface. The active area 152 of the second transistor 104 and the active area 154 of the third transistor 110 have the same six-sided shape and size along the planar surface. The shape of the active area 154 of the third transistor 110 is inverted relative to the shape of the active area 152 of the second transistor 104 along the planar surface.

More specifically, the non-linear shape of the third edge 162 faces the non-linear shape of the fourth edge 164 along the planar surface, and the non-linear shape of the third edge 162 is inverted relative to the non-linear shape of the fourth edge 164 along the planar surface. The non-linear shape of the third edge 162 has two sections (162a, 162c) parallel to the first common edge 160 and the second common edge 166, and a third section (162b) that is perpendicular to the two other sections 162a, 162c, and the third section 162b connects the two sections 162a, 162c. Similarly, the non-linear shape of the fourth edge 164 has two sections (164a, 164c) parallel to the first common edge 160 and the second common edge 166, and a third section (164b) that is perpendicular to the two other sections 164a, 164c, and the third section 164b connects the two sections 164a, 164c.

Figure 2:
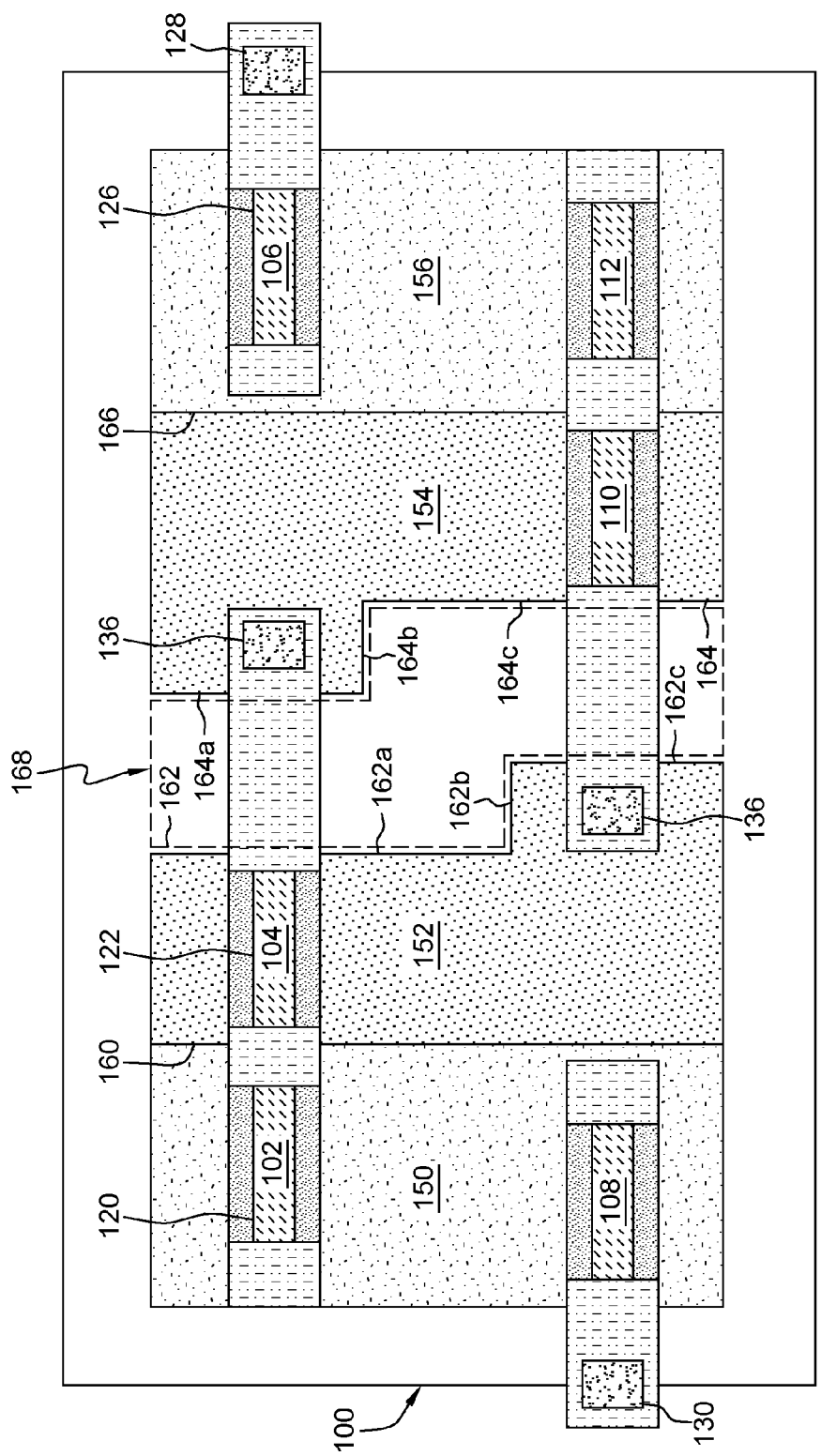

FIG. 2 illustrates a similar structure as that shown in FIG. 1 (and uses the same identification numbers), but FIG. 2 reverses the orientations of the active areas 152, 154. Such variations are intended to be included within the claims presented below because, depending on the technology groundrules, different active area orientations will provide the optimal SRAM bitcell size.

With such structures, certain groundrules must be maintained. For example, some groundrules may mandate that the D1 spacing between the gate contact 130 and the gate transistor 108 be within a specific range of distances or measurements; or similarly that the D2 spacing between transistors, the D3 spacing between active regions, and/or the D4 spacing between transistor and active region, etc., be within a specific range of distances or measurements. Such groundrules can thwart size reduction when smaller designs that move devices closer to one another violate such groundrules.

In order to avoid having to relax such groundrules when new designs provide device size reduction, the non-linear sides 162, 164 of the trench 168 area allows the D3 spacing to be continually maintained between the active regions 152 and 154, but still allows the rectangular active areas 150, 156 to be moved closer together, thereby reducing the overall size of the device (which in this example is an SRAM cell) without violating the D3 spacing groundrule.

FIGS. 3A-9B illustrate methods herein that form such transistor structures, where the A drawings (FIGS. 3A, 4A, 5A, etc.) illustrate top views of different stages of manufacturing on a planar substrate; and the B drawings (FIGS. 3B, 4B, 5B, etc.) illustrate side views side (views rotated 90° relative to the A drawings) along line A-A in the A drawings.

As shown in FIGS. 3A-3B, this processing patterns a hardmask 172 over a substrate 100, and then uses the hardmask 172 to form fins 170 on a planar surface of the substrate 100 by performing any common material removal process (e.g., etching, etc.) that attacks the material of the substrate 100 (with the hardmask 172 in place to protect the fins 170 from such a material removal process). FIG. 3A only identifies the location of fins that become the transistors 102-112 described above, and FIG. 3B similarly identifies the location of transistors 108-112 (described above) that are positioned along line A-A in FIG. 3A.

A hardmask can be formed of any suitable material, whether now known or developed in the future, such as a metal or organic hardmask, which has a hardness greater than the substrate and insulator materials used in the remainder of the structure. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Impurities can be added to the fins 170 at any point in the processing to make portions of the fins 170 the semiconductor regions of transistors. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

As shown in FIGS. 4A-4B, an insulator 174 is formed over the structure shown in FIGS. 3A-3B. In one example, the insulator 174 can be an oxide that is grown by exposing the structures shown in FIGS. 3A-3B to a heated oxygen-rich environment. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide.

The thickness of dielectrics herein may vary contingent upon the required device criteria. For example, while FIG. 4A illustrates the insulator 174 covering the entire structure, FIG. 4A also illustrates boxes around the fin 170 locations where the transistors 102-112 will eventually be formed. The thickness of the insulator 174 is shown in FIG. 4B and is represented by these boxes and FIG. 4A. The thickness of the insulator 174 determines the D4 spacing (without having to use a separate mask for the D4 spacing) and also protects the fins 170 during later material removal processes.

Figure 6A:
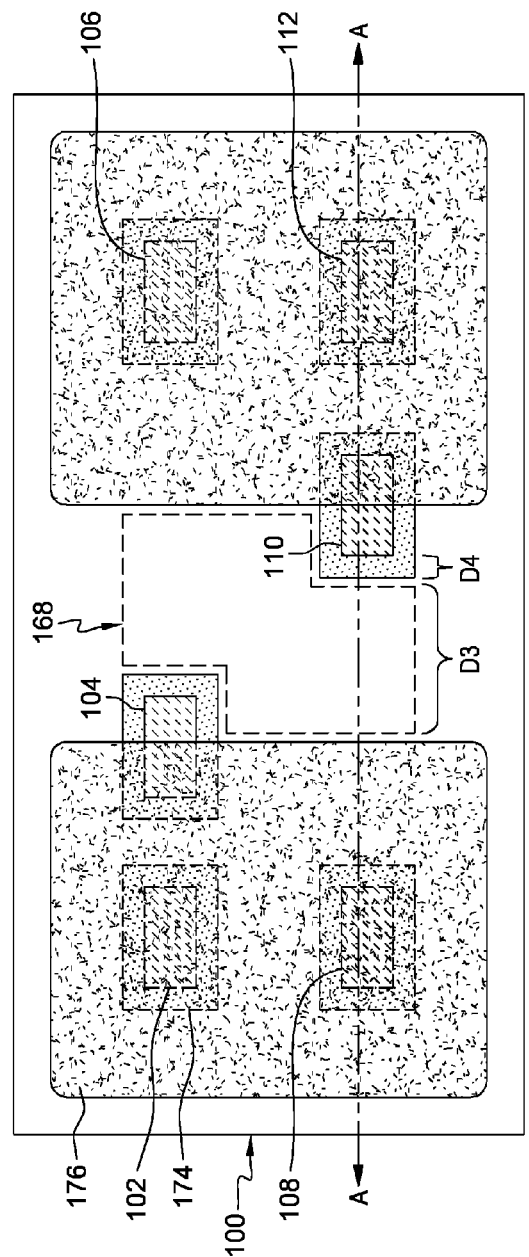
FIG. 6A is a schematic diagram illustrating a top view of devices herein.
Figure 6B:
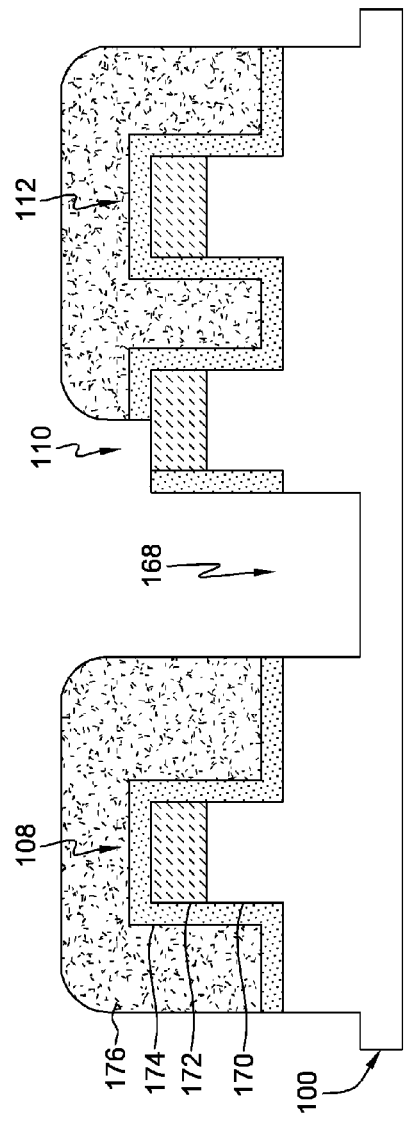
FIG. 6B is a schematic diagram illustrating a side view of the devices shown in FIG. 6A.

As shown in FIGS. 5A-5B, an additional mask 176 is patterned over the structure. As shown in FIGS. 6A-6B, using the mask 176, an additional material removal process (that attacks the insulator 174 and the substrate 100, but not the mask 176) removes the areas of the insulator 174 and the substrate 100 that are not protected by the mask 176. This processing forms a recess 168 that is shown in FIG. 6B. The location of this recess is also shown in FIG. 6A, using dashed lines.

Note that the thickness of the insulator material 174 in combination with the location of the mask 176 is used in the patterning process and defines the shape and location of this recess 168. Additionally, note that while the mask 176 does not fully cover the pull-up transistor locations 104, 110; the hardmask 172 and insulator 174 protect the underlying fin 170 from this material removal process. Additionally, using the thickness of the insulator 174 to control the D4 spacing self-aligns the D4 spacing (avoiding issues with mask alignment) and also self-aligns the location of the recess 168, which avoids the very difficult process of using a mask to control the D4 spacing.

Further, the thickness of the insulator 174 is a feature that contributes to the non-linear sides 162, 164 of the trench area 168. This is because the mask 176 in this example only has a linear edge in the region of the trench area 168. Utilization of the insulator 174 thickness to control the size of the jog of the non-linear sides 162, 164 makes such a jog self-aligned with the fins 170 of the pull-up transistors 104, 110; and this eliminates the problems of mask alignment, mask size, etc. In other words, the use of the insulator 174 (instead of a mask to form the non-linear sides 162, 164) promotes size reduction by eliminating errors that could be introduced when masks are used.

Figure 7A:
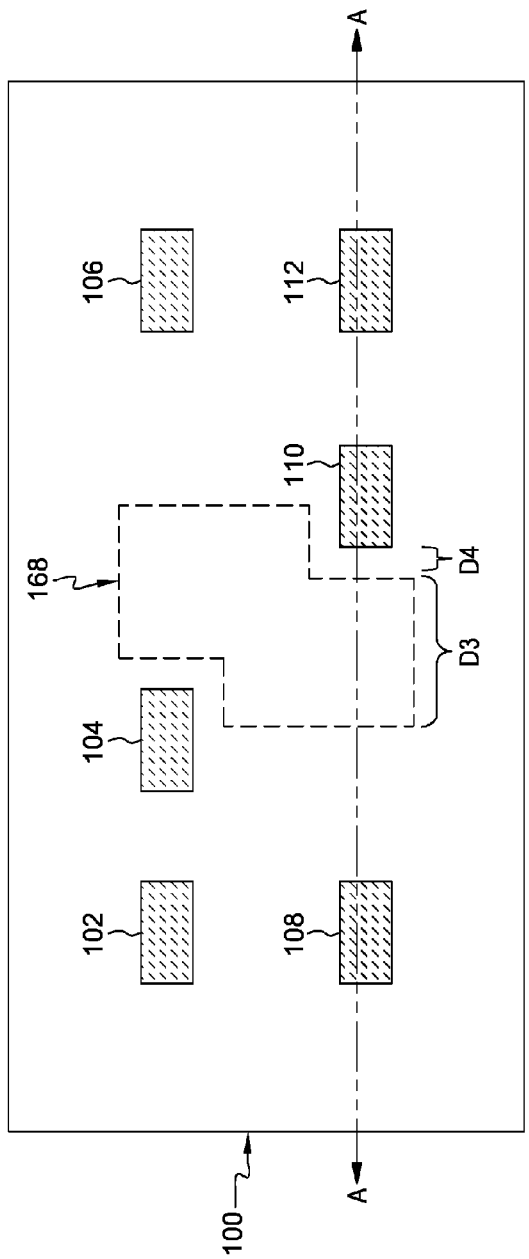
FIG. 7A is a schematic diagram illustrating a top view of devices herein.
Figure 7B:
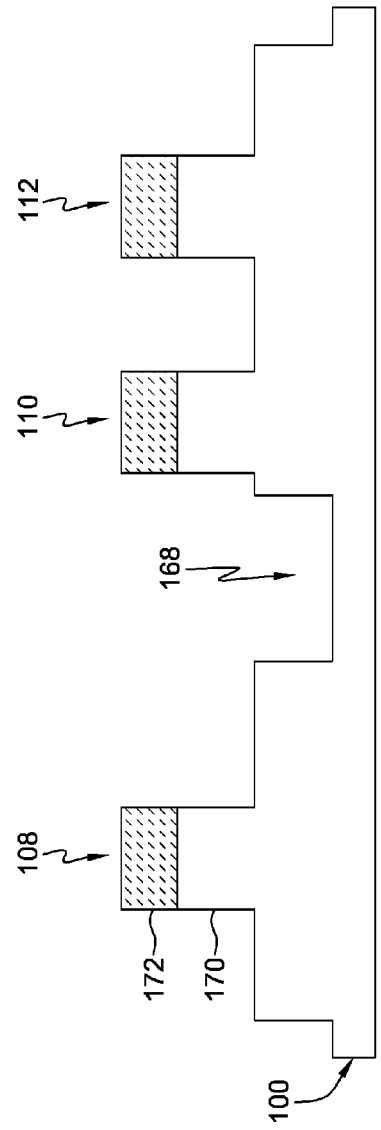
FIG. 7B is a schematic diagram illustrating a side view of the devices shown in FIG. 7A.

The mask 176 and the insulator 174 are removed, using material removal processes that do not attack the substrate 100 or the hard mask 172, as shown in FIGS. 7A-7B. Then, various impurities (using multiple masking and implantation processes) are added to the regions of the substrate 100 adjacent the fins 170 to form N-type regions (150, 156) and P-type regions (152, 154), as shown in FIGS. 8A-8B. Eventually the structure will be covered by one or more insulators 180.

Thus, such methods dope (add impurities to) the area for the first pair of complementary transistors 150, 152 adjacent the fins 170 to provide the first transistor 102 with an opposite polarity from the second transistor 104. Similarly, these methods dope (add impurities to) the area for the second pair of complementary transistors 154, 156 adjacent the fins 170 to provide the third transistor 110 with an opposite polarity from the fourth transistor 112. The doping of the area for the first and second pairs of complementary transistors dopes the first transistor 102 and the fourth transistor 112 to have the same first doping impurities and the same first polarity, and dopes the second transistor 104 and the third transistor 110 to have the same second doping impurities and the same second polarity. The first doping impurities are different (have an opposite polarity) from the second doping impurities.

In one example, the doped areas can include N-type regions 150, 156 and P-type regions 152, 154 that have opposite polarity doping. More specifically, a positive-type area "P-type" uses impurities such as boron, aluminum or gallium, etc., within a semiconductor substrate (to create deficiencies of valence electrons). Similarly, an "N-type" area is a negative-type area that uses impurities such as antimony, arsenic or phosphorous, etc., within a semiconductor substrate (to create excessive valence electrons).

Thus, as shown in FIGS. 8A-8B this processing patterns the planar surface of the substrate 100 to define an area 150, 152 for a first pair of complementary transistors 102, 104 and the pass transistor 108; and another area 154, 156 for a second pair of complementary transistors 110, 112 and the pass transistor 106, that is adjacent the first area 150, 152. The patterning process includes fins 170 for the transistors 102-112.

Thus, as discussed above with respect to FIGS. 1 and 2, these patterning and impurity addition processes pattern the active area 150 of the first transistor 102 to have a four-sided rectangular shape along the planar surface of the substrate 100, so that one side of the active area 150 of the first transistor 102 and the pass transistor 108 contacts the active area 152 of the second transistor 104 along a first common edge 160 that is straight. These patterning and impurity addition processes similarly pattern the active area 156 of the fourth transistor 112 and the pass transistor 106 to have a four-sided rectangular shape along the planar surface, so that one side of the active area 156 of the fourth transistor 112 contacts the active area 154 of the third transistor 110 along a second common edge 166 that is straight and parallel to the first common edge 160. As shown, the active area 152 of the second transistor 104 and the active area 154 of the third transistor 110 are patterned to be between the active area 150 of the first transistor 102 and the active area 156 of the fourth transistor 112 along the planar surface.

The patterning and impurity addition processes pattern the first common edge 160 to be shared by the active area 150 of the first transistor 102 and the active area 152 of the second transistor 154, and to define the border between the active area 150 of the first transistor 102 and the active area 152 of the second transistor 104. The patterning and impurity addition processes similarly pattern the second common edge 166 to be shared by the active area 154 of the third transistor 110 and the active area 156 of the fourth transistor 112, and to define the border between the active area 154 of the third transistor 110 and the active area 156 of the fourth transistor 112.

Such patterning and impurity addition processes also pattern the active area 152 of the second transistor 104 to lie along the planar surface and to have a third edge 162, opposite the first common edge 160, that has a non-linear shape defined by trench 168. These patterning and impurity addition processes similarly pattern the active area 154 of the third transistor 110 to lie along the planar surface and to have a fourth edge 164, opposite the second common edge 166, that has the same non-linear shape defined by the trench 168. The patterning and impurity addition processes form the non-linear shape to have two sections (162a, 162c; and 166a, 166c) that are parallel to the first common edge 160 and the second common edge 166; and a third section (162b and 164b) that are perpendicular to the two sections that connects the two sections.

Further, this processing patterns the non-linear shape of the third edge 162 to face the non-linear shape of the fourth edge 164 along the planar surface, and patterns the non-linear shape of the third edge 162 to be inverted relative to the non-linear shape of the fourth edge 164 along the planar surface. This process patterns the third edge 162 to be separated from the fourth edge 164 only by an insulator (an insulator that fills trench 168).

Figure 9:
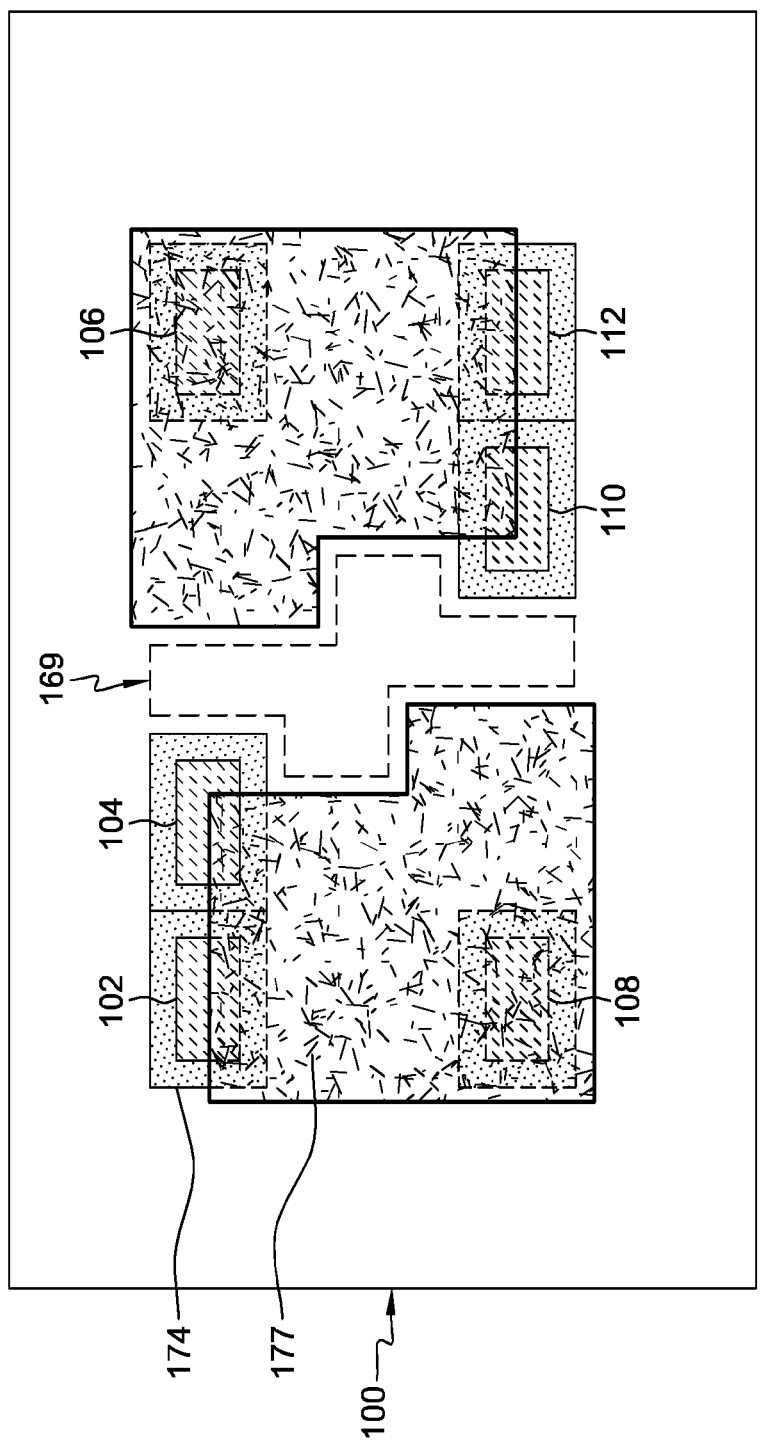
FIG. 9 is a schematic diagram illustrating a top view of devices herein.

FIG. 9 illustrates another example that uses differently shaped masks 177 to create a differently shaped trench region 169. Note that the insulator thickness 174 still controls at least a portion of the shape of the non-linear sides of the trench region 169.

Figure 10:
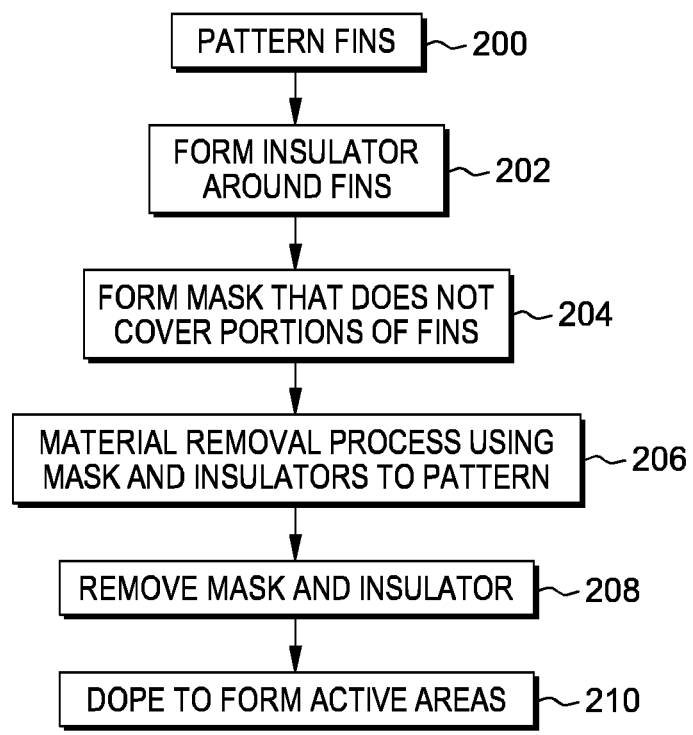
FIG. 10 is a flowchart illustrating processing herein.

FIG. 10 is a flowchart illustrating such processing shown in FIGS. 3A-9). In item 200, these processes pattern the substrate into fins (FIGS. 3A-3B). Then, in item 202, insulators are formed around the fins (FIGS. 4A-4B). Next, in item 204, these processes form a mask that does not cover some portions of fins, where for example the fins for transistors 104 and 110 are not fully covered by the mask 176 (FIGS. 5A-5B). This allows these methods to use both the mask and the insulators to pattern the trench 168 in a material removal process (as shown in item 206). In item 208, the mask and the insulator are removed. Then, as shown in item 210, the active areas are formed by adding impurities to the regions outside the trench 168, and not protected by the hardmasks 172.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a transistor structure comprising:
performing a patterning process on a planar surface of a substrate to define an area for a first set of transistors and a second set of transistors adjacent the first set of transistors, the patterning process positions a first transistor and a second transistor in the area for the first set of transistors, and a third transistor and a fourth transistor in the area for the second set of transistors;
adding impurities to the area for the first set of transistors to provide the first transistor with an opposite polarity from the second transistor; and
adding impurities to the area for the second set of transistors to provide the third transistor with an opposite polarity from the fourth transistor,
the patterning process patterns an active area of the first transistor to have a four-sided rectangular shape along the planar surface, so that one side of the active area of the first transistor contacts an active area of the second transistor along a first common edge that is straight,
the patterning process patterns an active area of the fourth transistor to have a four-sided rectangular shape along the planar surface, so that one side of the active area of the fourth transistor contacts an active area of the third transistor along a second common edge that is straight and parallel to the first common edge,
the patterning process patterns the active area of the second transistor to lie along the planar surface and to have a third edge, opposite the first common edge, that has a non-linear shape,
the patterning process patterns the active area of the third transistor to lie along the planar surface and to have a fourth edge, opposite the second common edge, that has a shape that is the same as the non-linear shape,
the patterning process patterns the non-linear shape of the third edge to face the non-linear shape of the fourth edge along the planar surface, and
the patterning process patterns the non-linear shape of the third edge to be inverted relative to the non-linear shape of the fourth edge along the planar surface.

2. The method according to claim 1, the patterning process patterns the non-linear shape to have two sections parallel to the first common edge and the second common edge, and a third section perpendicular to the two sections that connects the two sections.

3. The method according to claim 1, the patterning process patterns the third edge to be separated from the fourth edge only by an insulator.

4. The method according to claim 1, the processes of adding the impurities to the area for the first set of transistors and the second set of transistors:
dopes the first transistor and the fourth transistor to have the same first doping impurities and the same first polarity, and
dopes the second transistor and the third transistor to have the same second doping impurities and the same second polarity,
the first doping impurities are different from the second doping impurities.

5. The method according to claim 1, the patterning process patterns the first common edge to be shared by the active area of the first transistor and the active area of the second transistor and to define a border between the active area of the first transistor and the active area of the second transistor, and
the patterning process patterns the second common edge to be shared by the active area of the third transistor and the active area of the fourth transistor and to define a border between the active area of the third transistor and the active area of the fourth transistor.

6. The method according to claim 1, the patterning process patterns the active area of the second transistor and the active area of the third transistor to be between the active area of the first transistor and the active area of the fourth transistor along the planar surface.

7. The method according to claim 1, the patterning process patterns the active area of the first transistor and the active area of the fourth transistor to have the same four-sided rectangular shape and size,
the patterning process patterns the active area of the second transistor and the active area of the third transistor to have the same six-sided shape and size, and
the patterning process patterns the shape of the active area of the third transistor to be inverted relative to the shape of the active area of the second transistor.

8. A method of forming a transistor structure comprising:
patterning a substrate to form fins on a planar surface of the substrate;
performing a patterning process on the planar surface of the substrate to define an area for a first set of transistors and a second set of transistors adjacent the first set of transistors, the patterning process positions fins of a first transistor and a second transistor in the area for the first set of transistors, and fins of a third transistor and a fourth transistor in the area for the second set of transistors;
adding impurities to the area for the first set of transistors adjacent the fins to provide the first transistor with an opposite polarity from the second transistor; and
adding impurities to the area for the second set of transistors adjacent the fins to provide the third transistor with an opposite polarity from the fourth transistor,
the patterning process patterns an active area of the first transistor to have a four-sided rectangular shape along the planar surface, so that one side of the active area of the first transistor contacts an active area of the second transistor along a first common edge that is straight,
the patterning process patterns an active area of the fourth transistor to have a four-sided rectangular shape along the planar surface, so that one side of the active area of the fourth transistor contacts an active area of the third transistor along a second common edge that is straight and parallel to the first common edge, the patterning process patterns the active area of the second transistor to lie along the planar surface and to have a third edge, opposite the first common edge, that has a non-linear shape, the patterning process patterns the active area of the third transistor to lie along the planar surface and to have a fourth edge, opposite the second common edge, that has a shape that is the same as the non-linear shape, the patterning process patterns the non-linear shape of the third edge to face the non-linear shape of the fourth edge along the planar surface, and the patterning process patterns the non-linear shape of the third edge to be inverted relative to the non-linear shape of the fourth edge along the planar surface.

9. The method according to claim 8, the patterning process patterns the non-linear shape to have two sections parallel to the first common edge and the second common edge, and a third section perpendicular to the two sections that connects the two sections.

10. The method according to claim 8, the patterning process patterns the third edge to be separated from the fourth edge only by an insulator.

11. The method according to claim 8, the processes of adding impurities to the area for the first set of transistors and the second set of transistors:

dopes the first transistor and the fourth transistor to have the same first doping impurities and the same first polarity, and dopes the second transistor and the third transistor to have the same second doping impurities and the same second polarity, the first doping impurities are different from the second doping impurities.

12. The method according to claim 8, the patterning process patterns the first common edge to be shared by the active area of the first transistor and the active area of the second transistor and to define a border between the active area of the first transistor and the active area of the second transistor, and the patterning process patterns the second common edge to be shared by the active area of the third transistor and the active area of the fourth transistor and to define a border between the active area of the third transistor and the active area of the fourth transistor.

13. The method according to claim 8, the patterning process patterns the active area of the second transistor and the active area of the third transistor to be between the active area of the first transistor and the active area of the fourth transistor along the planar surface.

14. The method according to claim 8, the patterning process patterns the active area of the first transistor and the active area of the fourth transistor to have the same four-sided rectangular shape and size, the patterning process patterns the active area of the second transistor and the active area of the third transistor to have the same six-sided shape and size, and the patterning process patterns the shape of the active area of the third transistor to be inverted relative to the shape of the active area of the second transistor.

15. A method of forming a transistor structure comprising:

patterning a substrate to form fins on a planar surface of the substrate;

performing a patterning process on the planar surface of the substrate to define an area for a first set of transistors and a second set of transistors adjacent the first set of transistors, the patterning process positions fins of a first pull-down transistor, a first pull-up transistor, and a first pass transistor in the area for the first set of transistors, and fins of a second pull-up transistor, a second pull-down transistor, and a second pass transistor in the area for the second set of transistors;

adding impurities to the area for the first set of transistors adjacent the fins to provide the first pull-down transistor with an opposite polarity from the first pull-up transistor; and adding impurities to the area for the second set of transistors adjacent the fins to provide the second pull-up transistor with an opposite polarity from the second pull-down transistor, the patterning process patterns an active area of the first pull-down transistor to have a four-sided rectangular shape along the planar surface, so that one side of the active area of the first pull-down transistor contacts an active area of the first pull-up transistor along a first common edge that is straight, the patterning process patterns an active area of the second pull-down transistor to have a four-sided rectangular shape along the planar surface, so that one side of the active area of the second pull-down transistor contacts an active area of the second pull-up transistor along a second common edge that is straight and parallel to the first common edge, the patterning process patterns the active area of the first pull-up transistor to lie along the planar surface and to have a third edge, opposite the first common edge, that has a non-linear shape, the patterning process patterns the active area of the second pull-up transistor to lie along the planar surface and to have a fourth edge, opposite the second common edge, that has a shape that is the same as the non-linear shape, the patterning process patterns the non-linear shape of the third edge to face the non-linear shape of the fourth edge along the planar surface, and the patterning process patterns the non-linear shape of the third edge to be inverted relative to the non-linear shape of the fourth edge along the planar surface.

16. The method according to claim 15, the patterning process patterns the non-linear shape to have two sections parallel to the first common edge and the second common edge, and a third section perpendicular to the two sections that connects the two sections.

17. The method according to claim 15, the patterning process patterns the third edge to be separated from the fourth edge only by an insulator.

18. The method according to claim 15, the processes of adding impurities to the area for the first set of transistors and the second set of transistors:

dopes the first pull-down transistor and the second pull-down transistor to have the same first doping impurities and the same first polarity, and dopes the first pull-up transistor and the second pull-up transistor to have the same second doping impurities and the same second polarity, the first doping impurities are different from the second doping impurities.

19. The method according to claim 15, the patterning process patterns the first common edge to be shared by the active area of the first pull-down transistor and the active area of the first pull-up transistor and to define a border between the active area of the first pull-down transistor and the active area of the first pull-up transistor, and the patterning process patterns the second common edge to be shared by the active area of the second pull-up transistor and the active area of the second pull-down transistor and to define a border between the active area of the second pull-up transistor and the active area of the second pull-down transistor.

20. The method according to claim 15, the patterning process patterns the active area of the first pull-up transistor and the active area of the second pull-up transistor to be between the active area of the first pull-down transistor and the active area of the second pull-down transistor along the planar surface.

\* \* \* \* \*